United States Patent
Desai et al.

[11] Patent Number: 6,002,171
[45] Date of Patent: Dec. 14, 1999

[54] INTEGRATED HEAT SPREADER/STIFFENER ASSEMBLY AND METHOD OF ASSEMBLY FOR SEMICONDUCTOR PACKAGE

[75] Inventors: Kishor V. Desai, Livermore; Sunil A. Patel, Los Altos; John P. McCormick, Palo Alto, all of Calif.

[73] Assignee: LSI Logic Corporation, Milpitas, Calif.

[21] Appl. No.: 08/935,834

[22] Filed: Sep. 22, 1997

[51] Int. Cl.$^6$ .............................. H01L 23/10; H01L 23/34
[52] U.S. Cl. ......................... 257/707; 257/706; 361/717; 361/718
[58] Field of Search ................................... 257/706, 707, 257/778, 730; 361/717, 718

[56] References Cited

U.S. PATENT DOCUMENTS

| | | |
|---|---|---|
| 4,004,195 | 1/1977 | Harayda et al. |
| 5,019,673 | 5/1991 | Juskey et al. ............. 257/778 |
| 5,371,404 | 12/1994 | Juskey et al. ............. 257/778 |
| 5,409,865 | 4/1995 | Karnezos ................. 257/778 |
| 5,737,191 | 4/1998 | Horiuchi et al. .......... 257/778 |
| 5,744,863 | 4/1998 | Culnane et al. |

*Primary Examiner*—Mahshid Saadat
*Assistant Examiner*—S. V. Clark
*Attorney, Agent, or Firm*—Beyer & Weaver, LLP

[57] ABSTRACT

Provided is a multi-piece integrated heat spreader/stiffener assembly which is bonded to the substrate and die in a semiconductor package following electrical bonding of the die to the substrate, a packaging method using the integrated heat spreader/stiffener, and a semiconductor package incorporating the integrated heat spreader/stiffener. In a preferred embodiment, the integrated heat spreader/stiffener assembly has two pieces, both composed of a high modulus, high thermal conductivity material shaped to attach to each other and a die on the surface of a packaging substrate. A first piece of this assembly is bonded to the substrate surface adjacent to an electrically connected die and to the top surface of the die prior to the dispensation and curing of underfill material which provides the mechanical connection between the die and the substrate. With the first piece of the assembly in place, access may still be had to at least one edge of the die to dispense and cure the underfill epoxy. Once the underfill material is cured by heating, the second piece of the assembly is placed and bonded on the substrate either abutting or overlapping with the first piece. A ball grid array (BGA) process may then be used to apply solder balls to the underside of the substrate for subsequent bonding of the package to a circuit board for use.

19 Claims, 4 Drawing Sheets

FIG. 2B"

INTEGRATED HEAT SPREADER/STIFFENER ASSEMBLY AND METHOD OF ASSEMBLY FOR SEMICONDUCTOR PACKAGE

BACKGROUND OF THE INVENTION

This invention relates generally to semiconductor chip device assembly, and in particular to flip chip device assembly. More specifically, the invention relates to a multi-piece integrated heat spreader/stiffener assembly and method of its assembly in a semiconductor package which reduces stress and warpage of a semiconductor die during attachment of the die to a substrate.

In semiconductor device assembly, a semiconductor chip (also referred to as an integrated circuit (IC) chip or "die") may be bonded directly to a packaging substrate, without the need for a separate leadframe or for separate I/O connectors (e.g. wire or tape). Such chips are formed with ball-shaped beads or bumps of solder affixed to their I/O bonding pads. During packaging, the chip is "flipped" onto its active circuit surface so that the solder balls form electrical connections directly between the chip and conductive traces on a packaging substrate. Semiconductor chips of this type are commonly called "flip chips".

FIGS. 1A–F illustrate stages in a conventional method for packaging a semiconductor flip chip, in which a semiconductor die and a packaging substrate are electrically connected and mechanically bonded. FIG. 1A shows a cross-sectional, side view of an unbonded flip chip with the chip 100 having an active circuit surface 102 on which are arranged solder balls 104. The solder may be composed of a low melting point eutectic material or a high lead material, for example. It should be noted that this figure and the figures that follow are intended to be representative and, for example, do not show the solder balls 104 in proportion to the semiconductor die 100. In current designs, the die may have dimensions on the order of 0.5×0.5 inch (1 inch=2.54 cm) whereas the unbonded solder balls may have a diameter on the order of 4 to 5 mils (1 mil=$10^{-3}$ inch=0.0254 mm).

Prior to bonding the die 100 to a substrate, solder flux is applied to either the active surface 102 of the die 100 or the packaging substrate surface. The flux serves primarily to aid the flow of the solder, such that the solder balls 104 make good contact with traces on the packaging substrate. It may be applied in any of a variety of methods, including brushing or spraying, or dipping the die 100 into a thin film, thereby coating the solder balls 104 with flux. The flux generally has an acidic component, which removes oxide barriers from the solder surfaces, and an adhesive quality, which helps to prevent the die from moving on the packaging substrate surface during the assembly process.

As shown in FIG. 1B, after the flux is applied, the die 100 is aligned with and placed onto a placement site on the packaging substrate 106 such that the die's solder balls 104 are aligned with electrical traces (not shown) on the substrate 106. The substrate is typically composed of a laminate or organic material, such as fiber glass, PTFE (such as Teflon™, available form Gore, Eau Claire, Wis.) BT resin, epoxy laminates or ceramic-plastic composites. Heat (to a temperature of about 220° C, for example) is applied to one or more of the die 100 and the packaging substrate 106, causing the solder balls 104 to reflow and form electrical connections between the die 100 and the packaging substrate 106. Then, the remaining flux residue is substantially removed in a cleaning step, for instance by washing with an appropriate solvent.

At this point, the mechanical bonding procedure can begin. An underfill material, typically a thermo-set epoxy 108, such as is available from Hysol Corporation of Industry, California (product numbers 4511 and 4527), Ablestik Laboratories of Rancho Domingo, Calif. and Johnson Matthey Electronics of San Diego, Calif., is dispensed into the remaining space (or "gap") 107 between the die 100 and the substrate 106. In a typical procedure, a bead of thermo-set epoxy, is applied along one edge of the die where it is drawn under the die by capillary action until it completely fills the gap between the die and the packaging substrate. Slight heating of the packaging substrate after dispensing of the underfill epoxy assists the flow. In some cases, the underfill epoxy flow is further assisted by vacuum, or, alternatively, by injection of the epoxy into the gap.

After the epoxy 108 has bled through the gap 107, a separate bead of epoxy (not shown) may also be dispensed and bonded around the perimeter of the die 100. Thereafter, the epoxy (both the underfill and perimeter bonding epoxy, if any) are cured by heating the substrate and die to an appropriate curing temperature, for example, about 130 to 165° C. In this manner the process produces a mechanically, as well as electrically, bonded semiconductor chip assembly, with the underfill material 108 allowing a redistribution of the stress at the connection between the die 100 and the substrate 106 from the solder 104 joints only to the entire sub-die area. FIG. 1C shows the semiconductor die 100 interconnected to the packaging substrate 106 electrically by solder 104 joints and mechanically by a cured layer of epoxy 108.

Semiconductor packages are typically subject to temperature cycling during normal operation. In order to improve the thermal performance and reliability of the packages, a stiffener 110 may be placed around the die 100 on the substrate 106 where it is bonded with a heat curable adhesive (not shown), as shown in FIG. 1D. The stiffener 110 is typically a flat piece of high modulus (about 9×$10^6$ to 30×$10^6$ psi) metal about 10 to 40 mils thick, having substantially the same dimensions as the package substrate 106 with a window 111 in its center to clear the die 100. Typically, the stiffener 110 is composed of nickel-plated copper which has a coefficient of thermal expansion similar to that of typical substrate 106 materials. The stiffener 110 may be bonded to the substrate 106 prior to the placement, bonding and underfilling/curing steps previously described, or it may be bonded after the placement and bonding of the die 100, but prior to the underfilling/curing step. The stiffener is typically bonded and cured in a separate step following curing of the underfill material 108. The adhesive may also be cured concurrently with the curing of the underfill material in a single heating step.

The purpose of the stiffener 110 is to constrain the substrate 106 in order to prevent its warpage or other movement relative to the die 100 which may be caused by thermal cycling during operation of an electronic device in which the package is installed. Such movement may result from the different coefficients of thermal expansion (CTE) of the die 100 and substrate 106 materials, and may produce stress in the die or the package as a whole which can result in electrical and mechanical failures.

Next, as shown in FIG. 1E, a heat spreader 112, typically composed of a high thermal conductivity (about 2 to 4 W/cm·K) material, and having substantially the same dimensions as the package substrate 106, is attached over the stiffener 110 and the die 100 and bonded to each by a thermally conductive adhesive (not shown) which is also then heat cured. A conventional heat spreader is also typically a flat piece of nickel-plated copper about 20 to 40 mils thick. A conventional heat spreader 112 may not be applied until the underfill material 108 has been dispensed and cured because the heat spreader 112 prevents access to the die 100. Therefore, the heat spreader 112 is applied in a separate step following attachment of the die 100 and stiffener 110.

The purpose of the heat spreader is to disperse the heat generated during thermal cycling in order to reduce stress in the package due to different CTEs of the various elements of the package, including the die 100, substrate 106 and underfill 108. Since it covers and is attached to the die 100, the heat spreader 112 also plays a role is constraining the die 100 in place on the substrate 106, but only once the heat spreader 112 is attached in position following dispensation and curing of the underfill material 108.

In a final step of a conventional packaging process, shown in FIG. 1F, solder balls 114 are bonded to the underside 115 of the substrate 106. These solder balls 114 may be used to bond the chip package to a circuit board, such as a mother board, for use in an electronic application.

A problem with such flip chip package constructions is that during the heating and cooling involved in curing of the underfill material 108, the different CTEs of the substrate 106 and die 100 materials may stress these materials by causing them to warp or otherwise move relative to each other. In addition, the epoxy underfill 108 typically shrinks during the curing process, applying additional stress on the bonded die 100 and substrate 106 which may cause one or both to warp. As discussed above with reference to operational thermal cycling, such stress in the semiconductor package which may ultimately result in its electronic and/or mechanical failure, including cracking of the die 100.

Accordingly, what is needed are methods and apparatuses for improving the reliability of flip-chip packages by providing die constraint during the underfill curing process.

SUMMARY OF THE INVENTION

To achieve the foregoing, the present invention provides a multi-piece integrated heat spreader/stiffener assembly which is bonded to the substrate and die in a semiconductor package following electrical bonding of the die to the substrate, a packaging method using the integrated heat spreader/stiffener, and a semiconductor package incorporating the integrated heat spreader/stiffener. In a preferred embodiment, the integrated heat spreader/stiffener assembly has two pieces, both composed of a material having a high modulus (preferably about $9 \times 10^6$ to $30 \times 10^6$ psi; more preferably about $15 \times 10^6$ to $30 \times 10^6$ psi, and most preferably about $25 \times 10^6$ psi), high thermal conductivity (preferably about 2 to 4 W/cm·K; more preferably about 3 to 4 W/cm·K, and most preferably about 4 W/cm·K) material shaped to attach to each other and a die on the surface of a packaging substrate. A first piece of this assembly is bonded to the substrate surface adjacent to an electrically connected die and to the top surface of the die prior to the dispensation and curing of underfill material which provides the mechanical connection between the die and the substrate. For example, the first piece of the integrated heat spreader/stiffener assembly may be substantially L-shaped to perform this function. With the first piece of the assembly in place, access may still be had to at least one edge of the die to dispense and cure the underfill epoxy. Once the underfill material is cured by heating, the second piece of the assembly is placed and bonded on the substrate either abutting or overlapping with the first piece. A ball grid array (BGA) process may then be used to apply solder balls to the underside of the substrate for subsequent bonding of the package to a circuit board for use.

In a preferred embodiment, the present invention provides an integrated heat spreader/stiffener assembly for securing a semiconductor die to a packaging substrate. The integrated heat spreader/stiffener assembly includes a first piece having a top portion and a circumferential side region attached to the top portion. The top portion and circumferential side region partially define a cavity, the top of which is capable of covering and the circumferential sides of which are capable of partially enclosing a semiconductor die mounted on a packaging substrate. The first piece of the integrated heat spreader/stiffener assembly is capable of attaching to the die and to the packaging substrate to hold the die substantially in place on the substrate, and substantially prevent warpage of the die relative to the substrate. The assembly is completed by one or more additional pieces capable of assembling with the first piece. In preferred embodiments, the assembly is composed of two pieces, and the second piece of the assembly may abut or may overlap with the first piece.

In another embodiment, the present invention also provides a semiconductor package. The package includes a packaging substrate having a top side and an underside and a semiconductor die having an active surface and a top surface. The active surface of the die is bonded to the top side of the substrate, and an underfill material is between the die and the substrate. The package also includes a first piece of integrated heat spreader/stiffener assembly bonded to the top surface of the die and to the top side of the substrate. The first piece includes a top portion and a circumferential side region attached to the top portion. The top portion and circumferential side region partially define a cavity, the top of which is capable of covering and the circumferential sides of which are capable of partially enclosing a semiconductor die mounted on a packaging substrate. The first piece of the integrated heat spreader/stiffener assembly is capable of attaching to the die and to the packaging substrate to hold the die substantially in place on the substrate, and substantially prevent warpage of the die relative to the substrate. The assembly is completed by one or more additional pieces capable of assembling with the first piece. In preferred embodiments, the assembly is composed of two pieces, and the second piece of the assembly may abut or may overlap with the first piece. A semiconductor package according to this preferred embodiment of the present invention may also include a solder ball grid array attached to the underside of the substrate.

In another aspect, the present invention provides a method of making a semiconductor flip chip package. The method involves providing a packaging substrate having a top side and an underside, electrically bonding a semiconductor die to electrical traces on the top side of the substrate, and bonding a first piece of an integrated heat spreader/stiffener assembly to the top side of the substrate and to a top surface of the die. The first piece of the integrated heat spreader/ stiffener assembly has a top portion and a circumferential side region attached to the top portion. The top portion and side region of the first piece partially define a cavity, the top of the cavity covering and the circumferential side region of the cavity partially enclosing the semiconductor die mounted on the packaging substrate. The first piece of the assembly holds said die substantially in place on said substrate, and substantially prevents warpage of said die relative to said substrate. Next, an underfill material is dispensed between the die and the substrate through an opening in the circumferential side region, and the underfill material is cured. Then, one or more additional pieces are bonded to the first piece and the substrate to complete the cavity. In preferred embodiments, the assembly is composed of two pieces, and the second piece of the assembly may abut or may overlap with the first piece. A method according to this preferred embodiment of the present invention may also involve attaching a solder ball grid array to the underside of the substrate.

These and other features and advantages of the present invention are described below with reference to the drawings.

DETAILED DESCRIPTION OF THE PREFERRED EMBODIMENTS

The present invention provides a multi-piece integrated heat spreader/stiffener assembly for use in semiconductor flip chip packaging as a replacement for the conventional combination of a heat spreader and stiffener assembly, a packaging method using the integrated heat spreader/stiffener, and a semiconductor package incorporating the integrated heat spreader/stiffener assembly. In a preferred embodiment, the integrated heat spreader/stiffener assembly has two pieces, both composed of a high modulus, high thermal conductivity material shaped to attach to each other and a die on the surface of a packaging substrate. A first piece of this assembly is bonded to the substrate surface adjacent to an electrically connected die and to the top surface of the die prior to the dispensation and curing of underfill material which provides the mechanical connection between the die and the substrate. With the first piece of the assembly in place, access may still be had to at least one edge of the die to dispense and cure the underfill epoxy. Once the underfill material is cured by heating, the second piece of the assembly is placed and bonded on the substrate either abutting or lapping with the first piece. A ball grid array (BGA) process may then be used to apply solder balls to the underside of the substrate for subsequent bonding of the package to a circuit board for use.

In the following description, numerous specific details are set forth in order to fully illustrate preferred embodiments of the present invention. It will be apparent, however, that the present invention may be practiced without limitation to some specific details presented herein. For example, the integrated heat spreader/stiffener assembly may take may different forms beyond those specifically depicted and described herein, which firmly hold the die to the substrate while providing access to the die perimeter during underfill dispensation and cure at a location on the perimeter of the die not enclosed by the first piece of the assembly. The heat spreader/stiffener according to the present invention may be composed of several pieces, however, two-piece assemblies are preferred to minimize process steps.

Figure 1A:
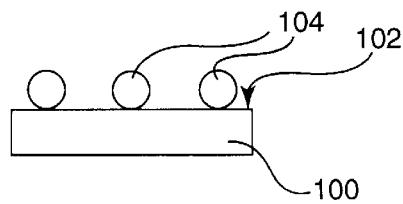
FIGS. 1A–F depict cross-sectional views of stages in the packaging of flip chip devices using a conventional stiffener and heat spreader.
Figure 1B:
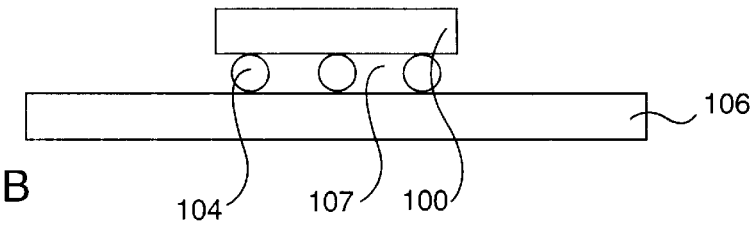
Figure 1C:
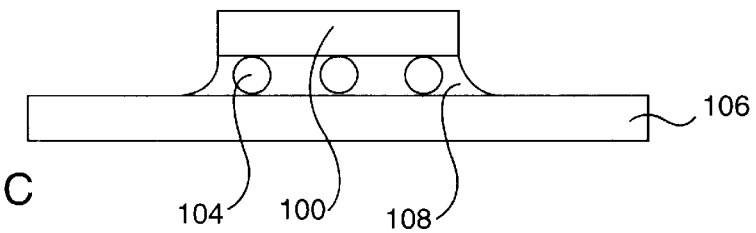
Figure 1D:
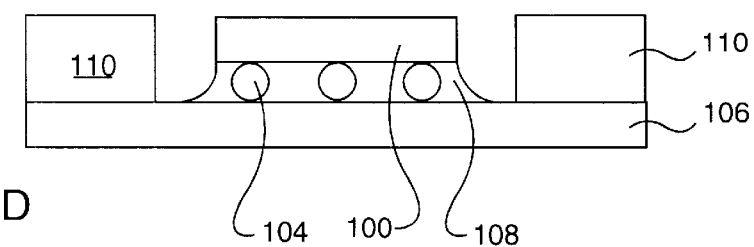
Figure 1E:
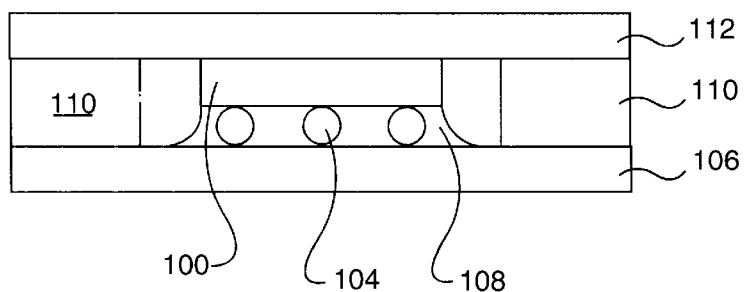
Figure 1F:
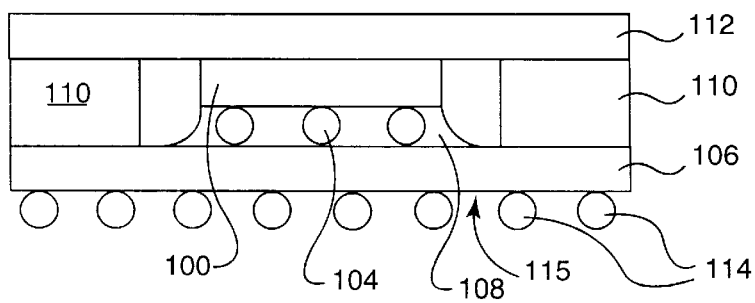
Figure 2A:
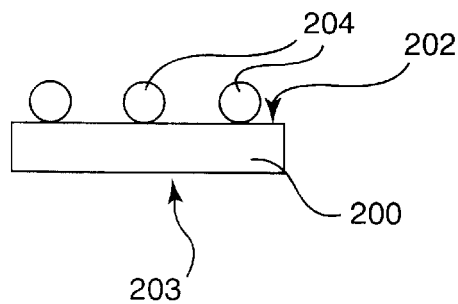
FIGS. 2A–F depict cross-sectional views of stages in the packaging of flip chip devices using an integrated heat spreader/stiffener assembly in accordance with a preferred embodiment of the present invention.

FIG. 2A shows a cross-sectional view of a semiconductor die (flip chip) 200 with solder balls 204 attached to its active surface 202. The die 200 and solder balls 204 may be of the conventional sort well known to those of skill in the art, and described above.

Figure 2B:
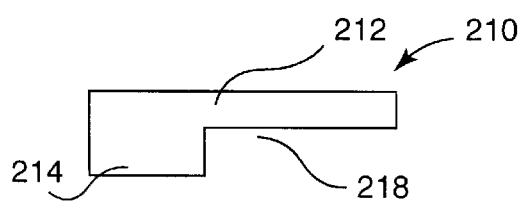
Figure 2B:
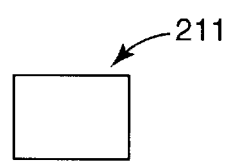

FIGS. 2B, 2B' and 2B" show cross-sectional views of pieces 210, 211 and 215 which may be used in a two-piece integrated heat spreader/stiffener assembly in accordance with preferred embodiments of the present invention. The pieces of the integrated heat spreader/stiffener may be composed of any substantially rigid, thermally conductive material compatible with the manufacture and operation of semiconductor packaging. In a preferred embodiment, the assembly pieces are composed of a high modulus (preferably about $9 \times 10^6$ to $30 \times 10^6$ psi; more preferably about $15 \times 10^6$ to $30 \times 10^6$ psi, and most preferably about $25 \times 10^6$ psi), high thermal conductivity (preferably about 2 to 4 W/cm·K; more preferably about 3 to 4 W/cm·K, and most preferably about 4 W/cm·K) material which provides the benefits of the rigidity and the heat dissipation characteristics of conventional stiffeners and heat spreaders, respectively. In a preferred embodiment, the integrated heat spreader/stiffener 210 is composed of a high modulus, high conductivity metal. A particularly preferred material is nickel-plated copper.

In the preferred embodiment depicted in FIG. 2B, the first piece 210 of the integrated heat spreader/stiffener assembly has a top portion 212 and a circumferential side portion 214 which partially define a cavity 218 designed to accommodate the die 200. The cavity 218 has a depth sufficient to accommodate the height of the die 200 when bonded to the substrate 206. For example, for a typical 225 mm² die, the cavity may preferably be about 15.5 to 20 mm long, by about 15.5 to 20 mm wide, by about 0.4 to 0.6 mm deep, more preferably about 16 mm long, by about 16 mm wide, by about 0.5 mm deep.

FIG. 2B' shows a second piece 211 of an integrated heat spreader/stiffener assembly according to a specific embodiment of the present invention in which the two pieces 210 and 211 abut one another in the finished package. In this particular embodiment, the second piece 211 serves as a side portion to complete the assembly.

FIG. 2B" shows an alternate second piece 215 of an integrated heat spreader/stiffener assembly according to another particular embodiment of the present invention in which the two pieces 210 and 215 lap one another in the finished package. This second piece 215 has top portion 216 capable of overlapping the top portion 212 of the first piece 210, and a circumferential side 217 portion capable of completing the enclosure of the die 200 when the two integrated heat spreader/stiffener pieces are assembled. It should be noted, as described above with respect to the second piece, that the pieces of the heat spreader/stiffener assembly may take a variety of forms adapted to enclose the die 200 when they are assembled in the finished package, as long as the first piece 210 is capable of substantially covering and holding the die 200 in place on the substrate and the second piece is capable of completing the enclosure of the die when assembled with the first.

Figure 2C:
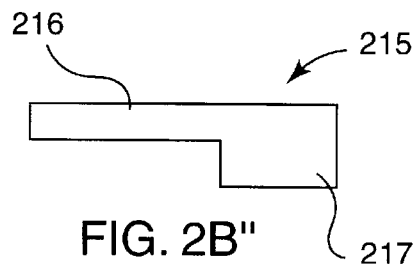
Figure 2C:
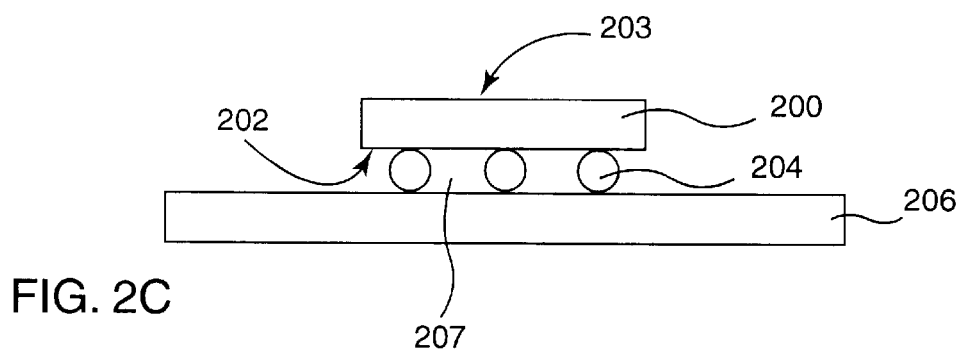

In FIG. 2C, the die 200 is shown bonded to a packaging substrate 206. This bonding may be accomplished in a conventional manner and using conventional materials, as described above. For example, prior to bonding the die 200 to the substrate 230 solder flux (not shown) may be applied to either the active surface 204 of the die 200 or the packaging substrate 206 surface. The flux may be applied in any of a variety of methods, including brushing or spraying, or dipping the die 200 into a thin film, thereby coating the solder balls 204 with flux. After the flux is applied, the die 200 is aligned with and placed onto a placement site on the packaging substrate 206 such that the die solder balls 204 are aligned with electrical traces (not shown) on the substrate 206. The substrate may be composed of a laminate or organic material, such as fiber glass, PTFE (such as Teflon™, available form Gore, Eau Claire, Wis.) BT resin, epoxy laminates or ceramic-plastic composites. Heat (to a temperature of about 220° C., for example) may be applied to one or more of the die 200 and the packaging substrate 206, causing the solder balls 204 to reflow and form electrical connections between the die 200 and electrical traces (not shown) on the packaging substrate 206. Then, the remaining flux residue is substantially removed in a cleaning step, for instance by washing with an appropriate solvent.

Figure 2D:
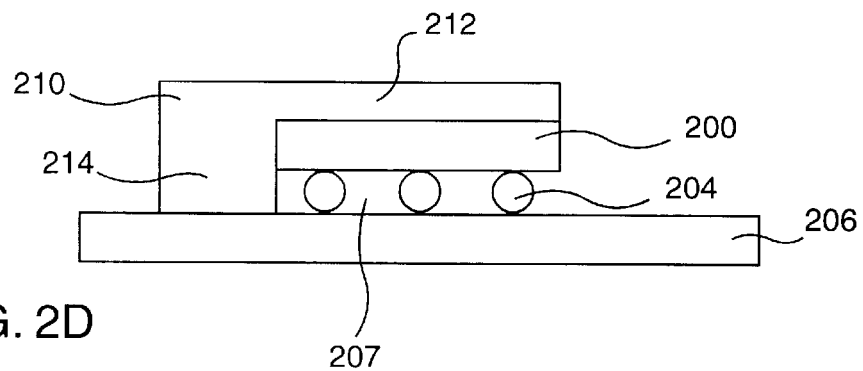

As shown in FIG. 2D, once the die 200 is bonded (electrically connected) to the substrate 206, a first piece 210 of an integrated heat spreader/stiffener assembly according a preferred embodiment of the present invention is placed over the die 200 for attachment to the top surface 203 of the die 200 and the substrate 206 surface. The attachment is preferably accomplished with a thermally conductive thermal adhesive. Such adhesives are well known to those skilled in the art. Alternatively or additionally, mechanical attachment means may be used to attach the first piece 210 of the assembly. In a preferred embodiment, the adhesive may be applied the to the top 212 of the first piece 210 of the heat spreader/stiffener within the cavity 218 and the bottom of the heat spreader/stiffener side portion 214 which contacts the substrate 206. The adhesive may additionally or alternatively be applied to the top surface 203 of the die 200 and the substrate 206 surface at the point where the first piece 210 of the integrated heat spreader/stiffener assembly contacts the substrate 206. In a preferred embodiment, the adhesive used to attach the integrated heat spreader/stiffener assembly pieces to the die 200, and that used to attach the pieces to the substrate 206 may be the same or different adhesives. In a preferred embodiment, the adhesive is cured by heating, for example to a temperature of about 100 to 150° C., once the heat spreader/stiffener 210 is in position.

With the die 200 electrically bonded and firmly held in place on the substrate 206 by the first piece 210 of the integrated heat spreader/stiffener assembly, an underfill material 208, such as a thermo-set epoxy, for example, those available from Hysol Corporation of Industry, California (product numbers 4511 and 4527), Ablestik Laboratories of Rancho Domingo, Calif., and Johnson Matthey Electronics of San Diego, Calif., is dispensed into the remaining space (or "gap") 207 between the die 200 and the substrate 206 through the access provided by the incomplete enclosure of the die 200 by the first piece 210 of the assembly. In a preferred embodiment, a bead thermo-set epoxy is dispensed along one or more edges of the die 200 where it is drawn under the die 200 by capillary action until it fills the gap 207 between the die 200 and the packaging substrate 206. Slight heating of the packaging substrate after dispensing of the underfill epoxy may be used to assist the flow. In some cases, the underfill epoxy flow may be further assisted by vacuum, or, alternatively, by injection of the epoxy into the gap.

Figure 2E:
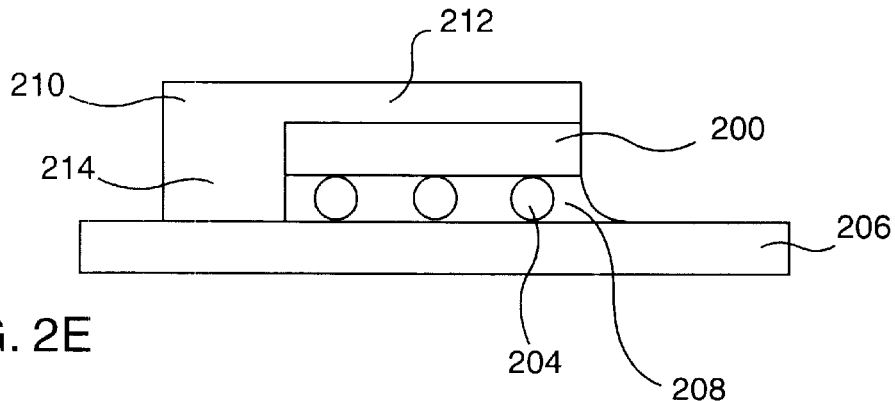

Then, as shown in FIG. 2E, after the underfill epoxy 208 has been dispensed into the gap 207 it may be cured by heating the substrate 206 and/or die 200 to an appropriate curing temperature, for example, about 100 to 165° C. In this manner, the mechanical bonding of the die 200 to the substrate by dispensing and curing of the underfill material 208 occurs with the die 200 firmly held in place on the substrate 206 by the first piece 210 of the integrated heat spreader/stiffener assembly. As such, the die is prevented from warping or otherwise moving during the curing step.

Figure 2F:
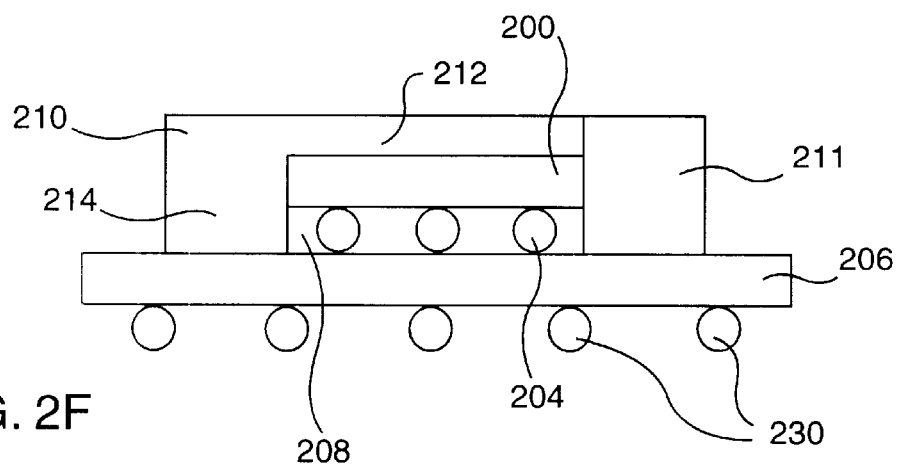
Figure 2F:
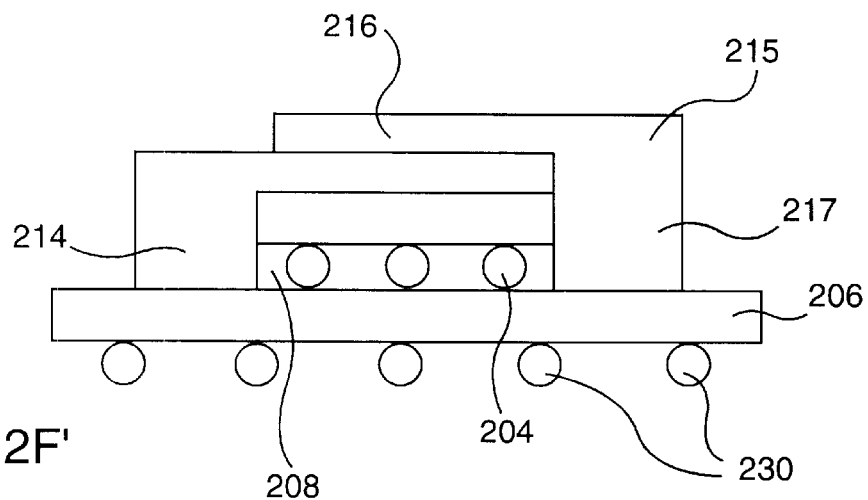

Once the underfill material 208 has been cured, a second piece of the integrated heat spreader/stiffener assembly may be placed on the substrate 206 and bonded to the first piece of the assembly 210 and the substrate 206. As noted above, the second piece of the assembly may have a variety of shapes in accordance with the present invention, two specific embodiments of which are described herein. The second piece is preferably also made of the same high modulus and high thermal conductivity material as the first piece. FIG. 2F shows a cross-sectional view of a semi conductor package in which a second piece 211, such as that illustrated in FIG. 2B', is used to complete the integrated heat spreader/stiffener assembly. The second piece 211 abuts the first piece 210 to complete the assembly and enclose the die 200. FIG. 2F' shows a cross-sectional view of a semi conductor package in which a second piece 215, such as that illustrated in FIG. 2B", is used to complete the integrated heat spreader/stiffener assembly. The second piece 215 overlaps the first piece 210 to complete the assembly and enclosure of the die 200.

In both cases, the attachment of the second piece 211 or 215 is preferably done in the same manner as the attachment of the first piece, using a thermal adhesive of the same sort used to attach the first piece 210. Again, alternatively or additionally, mechanical attachment means may be used to attach the second piece 211 or 215 of the assembly. The second piece provides additional rigidity and strength to the integrated heat spreader/stiffener assembly. In either case, the completed heat spreader/stiffener assembly performs the functions of conventional separate heat spreaders and stiffeners, with the advantage of additionally decreasing the likelihood of stress and damage to the die 200 and its connection to the substrate 206 during the underfill curing step.

In a preferred embodiment, also shown in FIGS. 2F and 2F', the package may further be prepared for subsequent attachment to a circuit board by attaching a solder ball grid array 230 to the underside of the packaging substrate 206, as in conventional packaging procedures.

Figure 3:
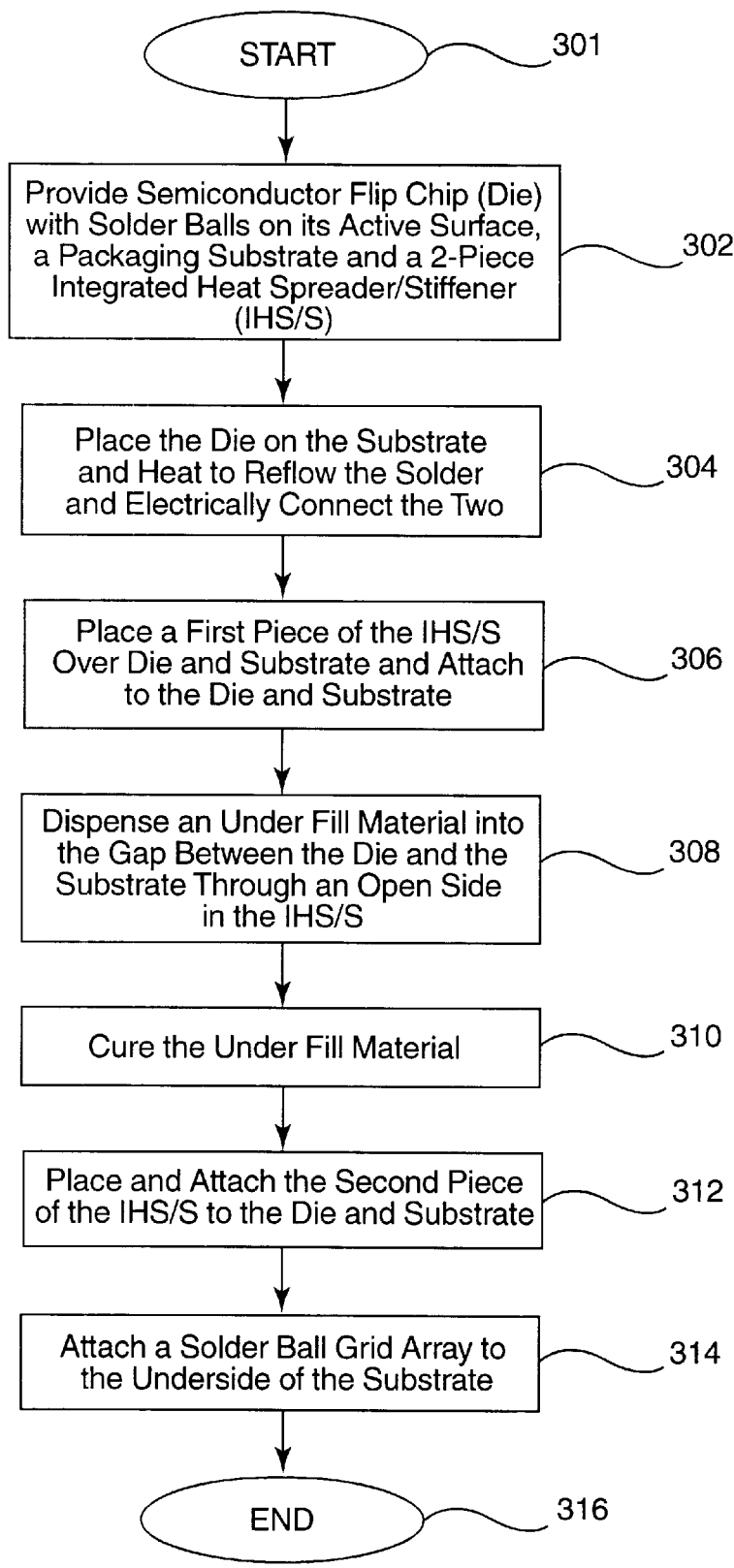
FIGS. 3 depicts a flow chart showing the steps of a method of packaging of flip chip devices using an integrated heat spreader/stiffener assembly in accordance with a preferred embodiment of the present invention.

FIG. 3 shows a flow chart 300 of a preferred method of packaging a semiconductor flip chip, in accordance with a preferred embodiment of the present invention. The method 300 begins at 301, and at a step 302 a semiconductor flip chip (die) with solder balls on its active surface, a packaging substrate and a two-piece integrated heat spreader/stiffener (IHS/S) in accordance with the present invention are provided. At a step 304, the die is placed on the substrate, the die and or the substrate having first been coated with flux, as described above, and the substrate and/or die is heated to reflow the solder balls and electrically connect the die to appropriate electrical traces on the substrate.

Then, at a step 306, a first piece of an integrated heat spreader/stiffener assembly in accordance with the present invention is placed over the die and attached to the die and the substrate. Preferably, the IHS/S is attached using a thermally conductive thermal adhesive such as are well known to those skilled in the art. Once the first piece of the IHS/S is attached over the die and firmly holding it in place on the substrate, an underfill material, such as a thermo-set epoxy, is dispensed into the gap between the die and the substrate through an open side of the first piece of the IHS/S, at a step 308. The underfill material is cured at a step 310 by heating the substrate and/or die to an appropriate curing temperature, which may be about 100 to 165° C. for a typical epoxy underfill. The presence of the first piece of the integrated heat spreader/stiffener assembly prevents warping or other movement of the die relative to the substrate during and following curing of the underfill material. This decreases the likelihood of package failure resulting from underfill curing, and thus enhances the reliability of the package. The IHS/S is then completed by attachment of the second piece to enclosed the die at a step 312. As noted above, the second piece of the IHS/S assembly may have a variety of shapes and modes of attachment to the first piece, including abutting and overlapping.

In a preferred embodiment, the package may be prepared for subsequent attachment to a circuit board by attaching a solder ball grid array to the underside of the packaging substrate at a step 314. The process is completed at 316.

Although the foregoing invention has been described in some detail for purposes of clarity of understanding, it will be apparent that certain changes and modifications may be practiced within the scope of the appended claims. Therefore, the present embodiments are to be considered as illustrative and not restrictive, and the invention is not to be limited to the details given herein, but may be modified within the scope of the appended claims.

What is claimed is:

1. An integrated heat spreader/stiffener assembly for securing a semiconductor die to a packaging substrate comprising:
    a packaging substrate;
    a semiconductor die mounted on the substrate;
    a first piece comprising a material, the first piece having,
        a top portion,
        a circumferential side region attached to said top portion, and
        a cavity partially defined by said top portion and said circumferential side region, the top of said cavity covering said semiconductor die and the circumferential side region of said cavity partially enclosing said semiconductor die;
    wherein said first piece of said integrated heat spreader/stiffener assembly is attached to said die and to said packaging substrate to hold said die substantially in place on said substrate, and substantially prevent warpage of said die relative to said substrate; and
    one or more additional pieces, at least one of which is coupled to said first piece such that said die is enclosed by a combination of said first piece and said one or more additional pieces.

2. The integrated heat spreader/stiffener assembly of claim 1 wherein said first piece and at least one of said one or more additional pieces are comprised of a material having a modulus between about 9×10⁶ and 30×10⁶ psi and a thermal conductivity between about 2 and 4 W/cm·K.

3. The integrated heat spreader/stiffener assembly of claim 2, wherein said material comprises nickel-plated copper.

4. The integrated heat spreader/stiffener assembly of claim 3, wherein said nickel-plated copper is about 10 to 50 mils thick.

5. The integrated heat spreader/stiffener assembly of claim 1, wherein said top portion of said first piece is substantially square in shape.

6. The integrated heat spreader/stiffener assembly of claim 5, wherein said cavity is about 15.5 to 20 mm long, by about 15.5 to 20 mm wide, by about 0.4 to 0.6 mm deep.

7. The integrated heat spreader/stiffener assembly of claim 6, wherein said cavity is about 16 mm long, by about 16 mm wide, by about 0.5 mm deep.

8. The integrated heat spreader/stiffener assembly of claim 1 wherein at least one of said one or more additional pieces abuts said first piece.

9. The integrated heat spreader/stiffener assembly of claim 1 wherein at least one of said one or more additional pieces overlaps said first piece.

10. A semiconductor package, comprising:
    a packaging substrate having a top side and an underside;
    a semiconductor die having an active surface, a top surface and a perimeter, said active surface of said die bonded to the top side of said substrate;
    an underfill material substantially disposed between said die and said substrate; and
    a first assembly comprising one or more pieces bonded to said top surface of said die and to said top side of said substrate, said first assembly comprising,
        a top portion,
        a circumferential side region, and
        a cavity partially defined by said top portion and said circumferential side region, the top of said cavity covering and the circumferential side region of said cavity partially enclosing the semiconductor die mounted on the packaging substrate+; and
    a second assembly comprising one or more pieces distinct from said one or more pieces of said first assembly, said second assembly attached to the top portion of said first assembly such that a plane defined by an interface between said first assembly and said second assembly is substantially perpendicular to a plane defined by the top side of said substrate;
    wherein said first piece is attached to said die and to said packaging substrate to hold said die substantially in place on said substrate, and substantially prevent warpage of said die relative to said substrate; and
    said semiconductor die is enclosed by a structure comprising said first piece and said second piece.

11. The semiconductor package of claim 10, further comprising a solder ball grid array attached to the underside of said substrate.

12. The semiconductor package of claim 10, wherein said underfill material comprises a thermo-set epoxy.

13. The semiconductor package of claim 10, wherein said pieces are comprised of a material having a modulus between about 9×10⁶ and 30×10⁶ psi and a thermal conductivity between about 2 and 4 W/cm·K.

14. The semiconductor package of claim 13, wherein said material comprises nickel-plated copper.

15. The semiconductor package of claim 14, wherein said nickel-plated copper is about 10 to 50 mils thick.

16. The semiconductor package of claim 10, wherein said top portion of said first assembly is substantially square in shape.

17. A semiconductor package of claim 10, wherein said second assembly abuts said first assembly.

18. The semiconductor package of claim 10, wherein said second assembly overlaps said first assembly.

19. An apparatus for securing a semiconductor die to a packaging substrate, comprising:
    a first means, comprising a material having a modulus between about 9×10⁶ and 30×10⁶ psi and a thermal conductivity between about 2 and 4 W/cm·K, for contacting and covering a top surface of a semiconductor die and partially circumferentially enclosing said die; and
    a second means, comprising material having a modulus between about 9×10⁶ and 30×10⁶ psi and a thermal conductivity between about 2 and 4 W/cm·K, separate from said first means, for completing the circumferential enclosure of said die;
    wherein said apparatus is capable of attaching to said die and to said packaging substrate to hold said die substantially in place on said substrate, and substantially prevent warpage of said die relative to said substrate.

* * * * *